United States Patent [19]

Moyer

[11] 4,379,343
[45] Apr. 5, 1983

[54] ELECTRICALLY ERASABLE PROGRAMMABLE READ-ONLY MEMORY CELL HAVING A SHARED DIFFUSION

[75] Inventor: Norman E. Moyer, Balboa, Calif.
[73] Assignee: Hughes Aircraft Company, Culver City, Calif.
[21] Appl. No.: 211,477
[22] Filed: Nov. 28, 1980
[51] Int. Cl.³ .............................................. G11C 7/00
[52] U.S. Cl. .................................. 365/185; 365/104; 357/23
[58] Field of Search ............... 365/174, 182, 185, 189, 365/218, 94, 104; 357/4, 23 VT, 24 R, 41, 45

[56] References Cited
U.S. PATENT DOCUMENTS 4,099,196 7/1978 Simko ................................... 357/23
4,132,904 1/1979 Harari .................................. 357/23

Primary Examiner—Joseph A. Popek
Attorney, Agent, or Firm—Robert M. Wallace; William J. Bethurum; Anthony W. Karambelas

[57] ABSTRACT

In a CMOS FATMOS EEPROM, in which a floating gate and its associated tunneling region overlies the source to drain channel, device density is dramatically improved by sharing a source diffusion between adjacent FATMOS transistors and by reversing the function of the source and drain diffusions between reading and writing operations. During writing of a logic "one" into an individual memory cell, the shared diffusion and the control gate are held at +18 volts while the well region is grounded and the other diffusion is selectively grounded.

7 Claims, 2 Drawing Figures

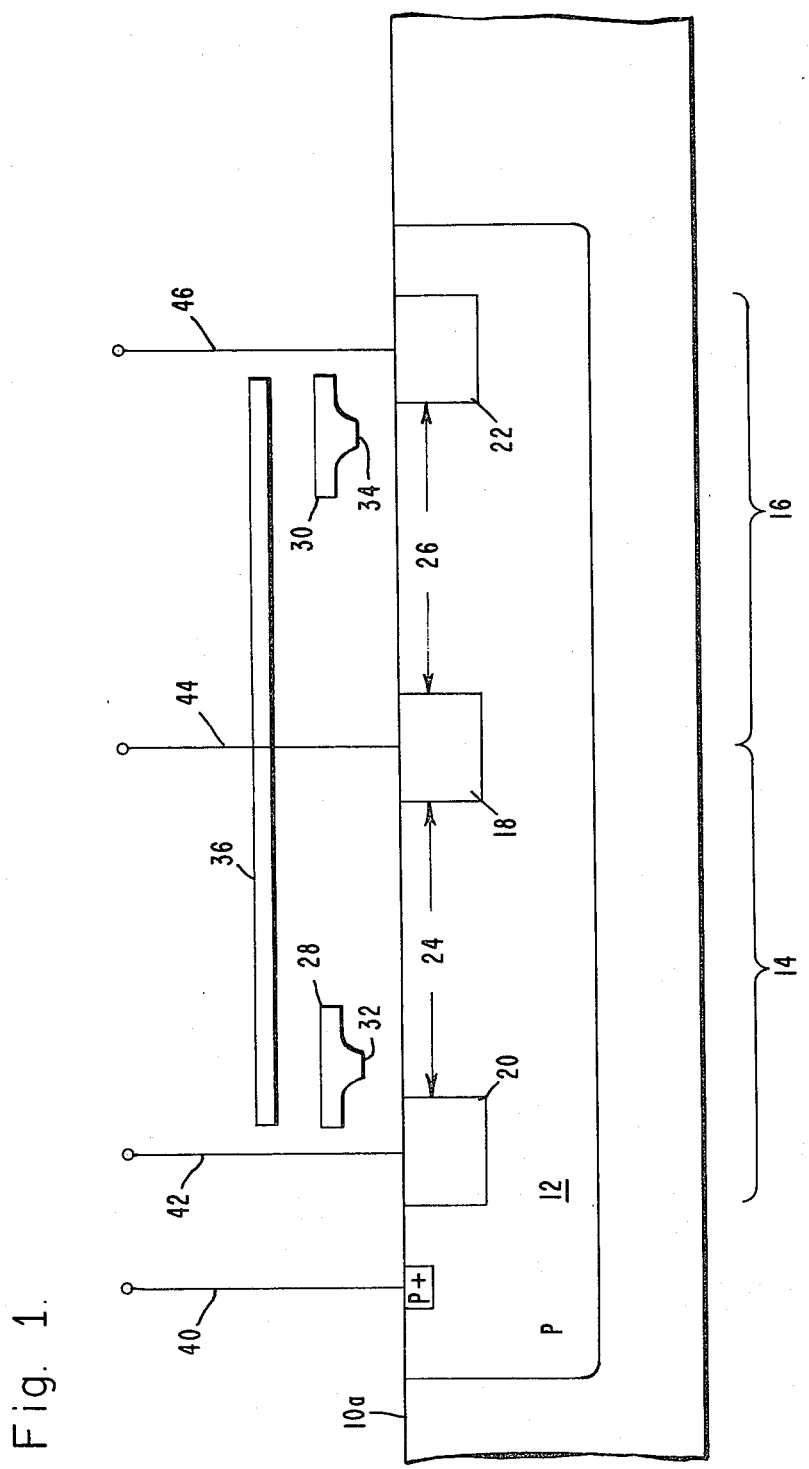

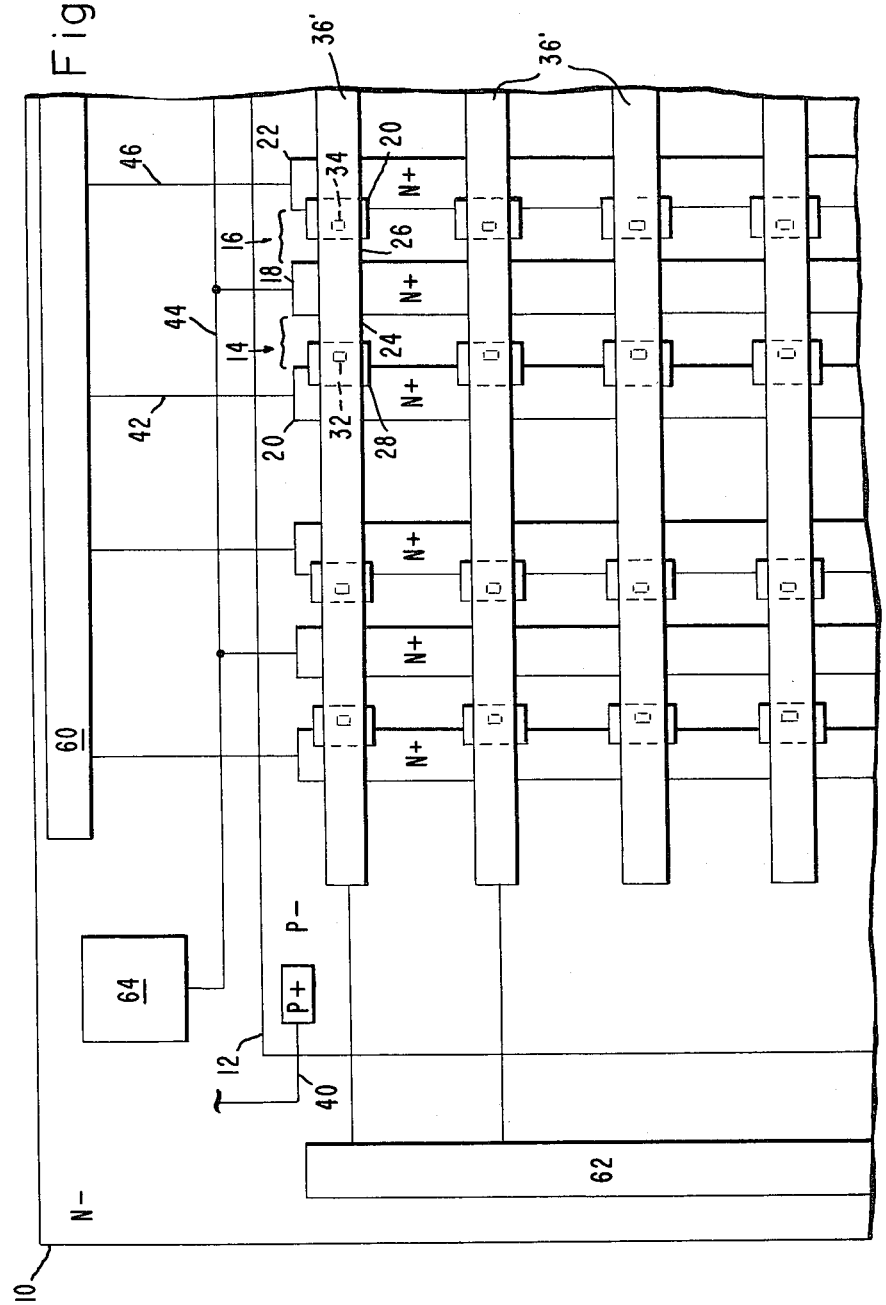

ELECTRICALLY ERASABLE PROGRAMMABLE READ-ONLY MEMORY CELL HAVING A SHARED DIFFUSION

TECHNICAL FIELD

This invention is related to electrically erasable programmable read-only memories using floating gate tunneling metal oxide semiconductor (FATMOS) field effect transistors (FET's) formed as n-channel devices in a p-type well.

BACKGROUND OF THE INVENTION

U.S. patent application Ser. No. 138,806 entitled "Electrically Erasable Programmable Read-Only Memory" filed by Frank M. Wanlass on Apr. 9, 1980 and assigned to the assignee of this application describes the first electrically erasable programmable read-only memory (EEPROM) formed as a complementary metal oxide semiconductor (CMOS) device including an n-channel floating gate tunneling metal oxide semiconductor field effect transistor (FATMOS FET) formed in a p-type well in which the electron tunneling region does not overlie the drain diffusion but instead overlies the source to drain channel. In the above-referenced application, Wanlass teaches that each FATMOS FET requires its own individual source and drain diffusions which may be shared among a plurality of FATMOS FET's in a single horizontal row. However, in accordance with the teachings of Wanlass, each row of FATMOS FET's includes its own source and drain diffusions, there being no sharing of diffusions between rows. In fact, because the Wanlass device includes a resistor connected between the drain diffusion and its bias voltage source, it is not possible to share the drain diffusion between adjacent transistors of the type disclosed by Wanlass when it is desired to simultaneously write different logic states into two adjacent memory cells in the same vertical column. Accordingly, it does not seem possible to share a diffusion between adjacent transistors of the type disclosed by Wanlass which are in the same column, limiting the device density.

SUMMARY OF THE INVENTION

In the present invention, two transistors of the type disclosed by Wanlass have a shared source diffusion between two drain diffusions. A novel feature of the invention which permits simultaneous writing of opposite logic states into the two transistors is reversal of the roles of the source and drain diffusions during the write operation. During the write operation, the well is held at ground potential, the shared source is held at +18 volts, and the selected gate is held at +18 volts. The drain of a transistor to be written with the logic "one" state is held at ground while the drain of a transistor to be left erased at logic "zero" is held at +18 volts. Thus, a channel will form between the source and drain in the transistor to be written with a logic one, and no channel will be present in the source-to-drain region of the transistor to be left erased. Since a channel is necessary for tunneling to occur and a logic one to be written, the writing in one memory cell does not affect the adjacent memory cell. During the reading operation, the source and drain diffusions revert to their usual roles, the source diffusion being held to ground and read-out circuitry being connected to the drains. The advantage of the invention is that sharing of the source diffusion saves space and therefore significantly increases device density on the substrate.

BRIEF DESCRIPTION OF THE DRAWING

FIG. 1 is a simplified cross-sectional view of a semiconductive substrate embodying the invention; and FIG. 2 is a simplified plan view of a memory array embodying the invention.

DETAILED DESCRIPTION OF THE INVENTION

CMOS FATMOS transistors are disclosed in the above-referenced Wanlass application, whose disclosure is hereby incorporated by reference in its entirety into this application. Individual source and drain diffusions are required for each row of FATMOS transistors and cannot be shared among adjacent rows, which imposes a significant limitation on device density. Even if one were to attempt to share, for example, a drain diffusion between adjacent rows and attempt to read data from the source diffusions, it would not be possible to write opposite logic states into two FATMOS transistors sharing the same drain diffusion. Specifically, the resistor (which Wanlass teaches must be disposed between the drain diffusion and its bias voltage source) permits the drain diffusion to approach the surface potential of the substrate whenever a logic one is written into one of the transistors sharing that diffusion, thus making it impossible to leave a logic zero in the adjacent transistor which shares the drain diffusion. (This is so because, as the drain approaches the substrate potential, it begins to function as a source for the adjacent transistor into which a logic zero was to have been left unchanged, causing formation of a channel and writing of a logic one, if the gate is turned on.)

This problem is completely overcome in the present invention illustrated in simplified cross-sectional view in FIG. 1. The invention includes a semiconductive substrate 10 of n-type conductivity, a well region 12 of a p-type conductivity formed in the surface 10a of the substrate 10, and two FATMOS FET's 14, 16 is formed in the p-type well 12. The FATMOS transistors 14, 16 share a common source diffusion 18 of n-type conductivity and each has a drain diffusion 20, 22 respectively, each defining a source to drain channel 24, 26 with the source diffusion 18. Overlying the channels 24, 26 are floating gates 28, 30 respectively, of the type disclosed in the above-referenced Wanlass application, each associated with a tunneling region 32,34 respectively, through which electrons may tunnel from the substrate surface 10a. Each FATMOS FET 14, 16 is controlled by means of a common overlying control gate 36, of the type disclosed in the above-referenced Wanlass application. As described in the above-referenced Wanlass application, an erase line 40 makes ohmic contact to the p-type well for controlling erasure of the FATMOS FET's 14, 16 using a procedure described therein. Suitable bias voltages are applied through electrical contacts 42, 44, 46 to the diffusions 20, 18 and 22 respectively, and also to the control electrode 36.

1. Read Operation

As described in the above-referenced Wanlass application, the logic state of each of the FATMOS FETs 14, 16 is determined by whether or not electrons are stored on the floating gates 28, 30 respectively, so as to raise the threshold voltage of the FATMOS FETs 14, 16 respectively. If a positive charge (shortage of electrons) is stored on the floating gate, the device stores a logic "zero". On the other hand, if electrons are stored on the floating gate, then the logic state is a logic "one".

In this invention the logic states of the FATMOS FET's 14, 16 are simultaneously read into external circuitry by grounding the source diffusion 18 at the contact 44, grounding the erase line 40 and applying a positive +5 volts to the control electrode 36. External logic sensing circuitry (not shown) is connected simultaneously through decoding means to the drain diffusions 20, 22 at the contacts 40, 46 respectively. If, for example, the FATMOS FET 14 has electrons stored on its floating gate 28, the negative electric charge on the floating gate 28 raises the threshold voltage and then decreases the current of electrons flowing from the source diffusion 18 to the drain diffusion 20, so that the potential of the drain diffusion 20 changes slowly. On the other hand, if a logic zero is stored in the FATMOS FET 16, corresponding to an absence of electrons on its floating gate 34, the threshold will be lowered and an increased electron current will flow from the source 18 to the drain 22 whenever +5 volts is applied to the overlying control gate 36, so that the potential of the drain diffusion 22 will change more rapidly, corresponding to a logic zero.

2. Erase Operation

Erasure of the FATMOS FETs 14, 16 is accomplished simultaneously in accordance with the procedure set forth in the above-referenced Wanlass application by setting the potential of the overlying control gate 36 to ground potential, setting the potential of each of the diffusions 20, 18, 22 to +18 volts and applying +18 volts to the erase line 40. Some electrons stored on either of the floating gates 28, 30 tunnel through the tunneling regions 32, 34 respectively, to the substrate surface 10a, so that the logic state stored in each FATMOS FET is zero.

3. Writing Operation

In accordance with the invention, logic states are written into the FATMOS FETs 14, 16 in a novel write procedure in which the role of the source and drain diffusions of each transistor 14, 16 are reversed. Specifically, the common source diffusion 18 acts as a drain diffusion during the writing operation because a positive 18 volts is applied to it through the contact 44. The drain diffusions 20, 22 function as source diffusions because they are selectively held at ground potential at their contacts 42, 46 respectively. If, for example, a logic one is to be written into the FATMOS FET 14, its drain 20 is grounded while the control gate 36 is held to +18 volts, which causes electrons to flow from the diffusion 20 to the common diffusion 18 in the channel 24, some of these electrons being attracted from the top surface 10a through the tunneling region 32 to be stored in the floating gate 28. Also, for example, if a logic zero is to be left unchanged in the FATMOS FET 16, its drain 22 is held at +18 volts while the control gate 36 is held at the same +18 volts potential to which the common source diffusion 18 is held. Thus, the gate voltage is not over threshold voltage and no channel forms, so that no electrons are present to tunnel through the tunneling region 34 onto the floating gate 30. Accordingly, the logic state of the FATMOS FET 16 remains unchanged during the writing operation. Thus, if the writing operation is preceded by an erase operation as described above, the logic state of the FATMOS FET 16 remains at logic "zero".

The following Table summarizes the voltages applied to each of the lines 40, 42, 44, 46 and gate 36 during the foregoing read, write, and erase operations for a logic one and for a logic zero.

TABLE

| FATMOS FET: | | 14 "1" | | 16 "0" | |
|---|---|---|---|---|---|
| Logic State to Write: | | | | | |
| Line | 40 | 42 | 36 | 44 | 46 |
| Operation: Write | 0 | 0 V | +18 V | +18 V | +18 V |
| Read | 0 | (Sense) | +5 V | +0 V | (Sense) |
| Erase | +18 V | +18 V | 0 V | +18 V | +18 V |

In an alternative embodiment of the invention, it is possible to read and write without reversing the role of the source and drain diffusions, although some speed may be lost. Specifically, this may be accomplished by operating the common diffusion 18 as a drain exclusively during both read and write operations and operating the individual diffusions 20, 22 as source diffusions exclusively (the "drain" diffusion 18 always being held at a potential which is more positive than the potential of the "source" diffusions 20, 22). In this alternative embodiment, the logic state of each FATMOS FET 14, 16 is sensed at the "source" diffusions 20, 22 by buffer decoder electronics (not shown) connected thereto.

A memory array embodying the invention is illustrated in simplified plan view in FIG. 2. FIG. 2 shows an exemplary location of the FATMOS FET's 14, 16 discussed above in a memory array formed on the semiconductive substrate 10 in the p-type well 12, including a plurality of common source diffusions 18, a plurality of drain diffusion pairs 20, 22 arranged in horizontal rows and a plurality of gate electrodes 36' arranged in vertical columns overlying a plurality of floating gate pairs 28, 30 and a plurality of tunneling region pairs 32, 34. A row buffer decoder 60 is connected to the drain diffusions 20, 22 and a column buffer decoder 62 is connected to the plurality of gate electrodes 36'. Source control electronics 64 are connected to the plurality of common source diffusions 18 while an erase line 40 makes ohmic contact to the well 12 in a well-known manner. The decoders 60, 62, the source control electronics 64 and the erase line 40 are operated in a manner consistent with the procedure described previously and summarized in the foregoing table to effect read, write and erase operations. Comparing the memory array of FIG. 2 with those illustrated in the above-referenced Wanlass application, it is apparent that the device density is dramatically improved by the sharing of the common source diffusions throughout the array.

What is claimed is:

1. An electrically erasable programmable memory comprising:
   a semiconductive substrate of a first conductivity type;
   a well region of a second conductivity type in said substrate;
   a common diffusion in said well region of said first conductivity type;
   first and second diffusions in said well region of said first conductivity type located on opposite sides of said common diffusion and forming first and second source-to-drain channels, respectively, with said common diffusion;
   first and second floating gates overlying said first and second channels respectively, each of said floating gates associated with a tunneling region permitting charge flow between said substrate and said floating gates; and means overlying said first and second floating gates, for controlling charge flow in said channels.

2. A method for programming adjacent floating gate metal oxide semiconductor field effect transistors formed in a well region and sharing a common diffusion, each having a source-to-drain channel and an individual diffusion associated therewith, an overlying floating gate associated with an electron tunneling region, and overlying control electrode means, said programming method being capable of leaving a logic "zero" in one of said transistors while writing a logic "one" into the other of said transistor simultaneously, comprising:
applying a potential of one polarity to said common diffusion, to one of said individual diffusions and to said control electrode means; and
applying another potential of said one polarity and of less magnitude to said well region and to the other of said individual diffusions.

3. The method of claim 2 wherein said polarity is positive.

4. A method for programming an electrically erasable programmable read only memory having at least first and second transistors formed in a well region on a semiconductive substrate, said first and second transistors comprising, respectively, first and second drain diffusions, first and second floating gates associated with first and second tunneling regions, control electrode means and a common source diffusion shared between said first and second transistors, said programming method being capable of simultaneously tunneling charge to or from said first floating gate while not tunneling charge to or from said second gate, comprising:
applying a voltage of one polarity to said first drain diffusion and to said well region; and
applying another voltage of said one polarity and a greater magnitude to said control electrode means, to said second drain diffusion and to said shared source diffusion.

5. The method of claim 4 wherein said polarity is positive.

6. A CMOS FATMOS memory comprising:
a semiconductive substrate of a first conductivity type;
a well region of a second conductivity type in said substrate;
first and second drain diffusions of said first conductivity type disposed in said well region;
a shared source diffusion of said first conductivity type located in said well region between said first and second drain diffusions and defining first and second channels with said first and second drain diffusions respectively in said well region;
first and second floating gates associated with first and second tunneling regions overlying said first and second channels respectively;
means overlying said first and second floating gates for controlling charge flow in said channels respectively;
means connected to said drain diffusions and to said common source diffusion for controlling the charge flow between said first and second channels and said first and second floating gates respectively; and
means connected to said well region for controlling the erasure of charge from said first and second floating gates.

7. A CMOS FATMOS memory array comprising:
a semiconductive substrate of a first conductivity type;
a well region of a second conductivity type in said substrate;
a plurality of drain diffusion pairs of said first conductivity type disposed in said well region;
a plurality of shared source diffusions of said first conductivity type, each located in said well region between ones of said drain diffusion pairs and defining a plurality of channels with said plurality of drain diffusions in said well region;
a plurality of floating gates associated with a plurality of tunneling regions overlying said plurality of channels;
control electrode means overlying said channels and said floating gates for controlling charge flow in said channels;
means connected to said drain diffusions and to said common source diffusions for controlling charge flow between said channels and said floating gates; and
means connected to said well region for controlling the erasure of charge from said floating gates.

* * * * *

UNITED STATES PATENT AND TRADEMARK OFFICE
CERTIFICATE OF CORRECTION

PATENT NO. : 4,379,343

DATED : April 5, 1983

INVENTOR(S) : Norman E. Moyer

It is certified that error appears in the above-identified patent and that said Letters Patent is hereby corrected as shown below:

Column 5, line 36, "of" should read -- a --.

Signed and Sealed this

First Day of November 1983

[SEAL]

Attest:

GERALD J. MOSSINGHOFF

Attesting Officer

Commissioner of Patents and Trademarks